United States Patent
Melham et al.

(10) Patent No.: US 7,310,790 B2
(45) Date of Patent: Dec. 18, 2007

(54) AUTOMATIC SYMBOLIC INDEXING METHODS FOR FORMAL VERIFICATION ON A SYMBOLIC LATTICE DOMAIN

(75) Inventors: Thomas F. Melham, Oxford (GB); Robert B. Jones, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 563 days.

(21) Appl. No.: 10/309,529

(22) Filed: Dec. 3, 2002

(65) Prior Publication Data

US 2004/0107409 A1 Jun. 3, 2004

(51) Int. Cl.
G06F 17/50 (2006.01)
G06F 9/45 (2006.01)

(52) U.S. Cl. .............................. 716/5; 716/3
(58) Field of Classification Search ............. 716/4, 716/2, 5; 707/1; 703/14
See application file for complete search history.

(56) References Cited

U.S. PATENT DOCUMENTS

| | | | | |
|---|---|---|---|---|
| 6,163,876 A * | 12/2000 | Ashar et al. | ...................... | 716/5 |
| 6,339,837 B1 * | 1/2002 | Li | ...................... | 716/5 |
| 6,378,112 B1 * | 4/2002 | Martin et al. | ...................... | 716/5 |
| 6,484,134 B1 * | 11/2002 | Hoskote | ...................... | 703/14 |
| 6,539,345 B1 * | 3/2003 | Jones et al. | ...................... | 703/15 |
| 6,567,959 B2 * | 5/2003 | Levin et al. | ...................... | 716/5 |
| 6,591,400 B1 * | 7/2003 | Yang | ...................... | 716/2 |
| 6,643,827 B1 * | 11/2003 | Yang | ...................... | 716/2 |
| 6,725,431 B1 * | 4/2004 | Yang | ...................... | 716/4 |
| 6,931,611 B2 * | 8/2005 | Martin et al. | ...................... | 716/5 |
| 2004/0107174 A1 * | 6/2004 | Jones et al. | ...................... | 707/1 |

OTHER PUBLICATIONS

"Abstraction by Symbolic Indexing Transformations", T. F. Melham et al., Proceedings of the 4th Int. Conference on Formal Methods in Computer-Aided Design, Nov. 6-8, 2002.*

"A Methodology for Hardware Verification Based on Logic Simulation", Randal E. Bryant, Journal of the Ass. for Computing Machinery, vol. 38, No. 2, Apr. 1991, pp. 299-328.*

"Formal Verification of Content Addressable Memories using Symbolic Trajectory Evaluation", Pandey M. et al., ACM 1997.*

(Continued)

Primary Examiner—Leigh M. Garbowski
(74) Attorney, Agent, or Firm—Larry M. Mennemeier

(57) ABSTRACT

Processes for formal verification of circuits and other finite-state systems are disclosed. For one embodiment, a process is disclosed to provide for significantly reduced computation through automated symbolic indexing of a property assertion and to compute the satisfiability of the property assertion directly from a symbolic simulation of the indexed property assertion. For an alternative embodiment a process using indexed property assertions on a symbolic lattice domain to represent and verify properties, provides an efficient symbolic manipulation technique using binary decision diagrams (BDDs). Methods for computing symbolic simulations, and verifying satisfiability may be applicable with respect to property assertions that are symbolically indexed under specific disclosed conditions. A process is also disclosed to compute a constraint abstraction for a property assertion, thereby permitting automated formal verification of symbolically indexed properties under constraints and under specific conditions, which may be automatically checked.

32 Claims, 10 Drawing Sheets

OTHER PUBLICATIONS

"Functional Verification of Multi-Million Gates ASICs for Designing Communications Networks: Trends, Tools and Techniques", MK Dhodhi et al., Microelectronics, 1999. ICM '99.*

"Formal Verification of PowerPC arrays using symbolic trajectory evaluation", M. Pandey et al., ACM Proceedings of the 33rd Annual Conf. on Design Automation, pp. 649-654, 1996.*

"A Simple Theorem Prover Based on Symbolic Trajectory Evaluation and BDD's", S. Hazelhurst et al., IEEE Trans. of Computer-Aided Design of Integrated Circuits and Systems, vol. 14, No. 4, Apr. 1995.*

"Success-Driven Learning in ATPG for Preimage Computation", S. Sheng et al., IEEE Design & Test of Computers, pp. 504-512, Nov.-Dec. 2004.*

"Practical Formal Verification in Microprocessor Design", R. B. Jones et al., IEEE Design & Test of Computers, pp. 16-25, Jul.-Aug. 2001.*

MK Dhodhi et al., Functional Verification of Multi-Million Gates ASICs for Designing Communications Networks: Trends, Tools and Techniques, Microelectronics, 1999. ICM '99.*

S. Sheng et al., Success-Driven Learning in ATPG for Preimage Computation, IEEE Design & Test of Computers, pp. 504-512, Nov.-Dec. 2004.*

Aagaard, Mark D., et al., "Formal Verification Using Parametric Representations of Boolean Constraints", Strategic CAD Labs, Intel Corporation, Hillsboro OR 97124 USA, 6 pages. DAC 1999, New Orleans, Louisiana.

Melham, Thomas F. and Jones, Robert B., "Abstraction by Symbolic Indexing Transformations", 14 pages, Lecture Notes in Computer Science, 2002 (2517) ISSN: 030229743 UCM Biblioteca Compulutense.

Yang, Jin and Tiemeyer, Andreas, "Lazy Symbolic Model Checking", 4 pages 37th DAC Session 2.3 S, LA Technical Program, Tuesday, Jun. 6, 2000, Los Angeles Convention Center.

* cited by examiner

| | |
|---|---|
| a, b, c, o =1101 | a, b, c, o =1100 |
| a, b, c, o =0101 | a, b, c, o =0100 |
| a, b, c, o =0111 | a, b, c, o =0110 |
| a, b, c, o =0011 | a, b, c, o =0010 |
| a, b, c, o =0001 | a, b, c, o =0000 |
| a, b, c, o =1001 | a, b, c, o =1000 |
| a, b, c, o =1011 | a, b, c, o =1010 |
| a, b, c, o =1110 | a, b, c, o =1111 |
| 202 | 201 |

203

| p, q → | a, | b, | c, | o |
|---|---|---|---|---|
| 0 0 → | 0 | x | x | x |
| 0 1 → | x | 0 | x | x |
| 1 0 → | x | x | 0 | x |
| 1 1 → | 1 | 1 | 1 | x |

| r, s → | r, | ¬r, | 0, | ¬r∨s |
|---|---|---|---|---|
| 0 0 → | 0 | 1 | 0 | 1 |
| 0 1 → | 0 | 1 | 0 | 1 |
| 1 0 → | 1 | 0 | 0 | 0 |
| 1 1 → | 1 | 0 | 0 | 1 |

AUTOMATIC SYMBOLIC INDEXING METHODS FOR FORMAL VERIFICATION ON A SYMBOLIC LATTICE DOMAIN

FIELD OF THE INVENTION

This invention relates generally to mechanized design verification, and in particular to formal property verification for very large-scale integrated circuit designs and other finite-state systems.

BACKGROUND OF THE INVENTION

As hardware and software systems become more complex there is a growing need for mechanized formal verification methods. These methods are mathematically based techniques and languages that help detect and prevent design errors, thereby avoiding losses in design effort and financial investment.

One method for verifying properties of circuits and finite-state systems is known as Symbolic Trajectory Evaluation (STE). STE is an efficient model checking algorithm especially suited to verifying properties of large datapath designs (with thousands or tens of thousands of state encoding variables). In STE the Boolean data domain {0, 1} is extended to a partially-ordered state space including "don't care" values, X, for which their Boolean value is unknown.

One disadvantage associated with symbolic methods for verifying properties of circuits and finite state systems is known as state explosion. The state explosion problem is a failure characterized by exhaustion of computational resources because the required amount of computational resources expands (sometimes exponentially) according to the number of states defining the system.

A useful approach for reducing complexity in STE is called symbolic indexing. Symbolic indexing is a technique for formulating STE verification properties that exploit the partially ordered state space to use fewer state encoding variables, thereby reducing computation. One drawback has been that the process of manually encoding verification properties into indexed form may be tedious and prone to error. Another drawback has been that indexed verification results provide only an implied verification, which typically depends on some informal reasoning rather than explicit automated checks, and the indexed properties that are verified may not be directly applicable at higher levels of verification. There has also been no characterization of the conditions under which properties that are applicable at higher levels of verification can be derived from indexed properties. As a consequent, few practitioners have understood and mastered the techniques required to use symbolic indexing effectively.

BRIEF DESCRIPTION OF THE DRAWINGS

The present invention is illustrated by way of example and not limitation in the figures of the accompanying drawings.

FIG. 2b illustrates an indexing relation for the input variables of circuit 101.

FIG. 9 illustrates a parameterized constraint for four input variables.

DETAILED DESCRIPTION

Figures 1, 2A:
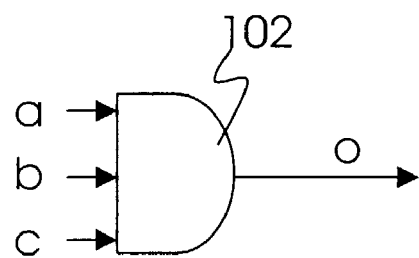
FIG. 1 shows an example of a simple circuit.
FIG. 2a illustrates sixteen possible state vectors according to assignment of one or zero to the four state encoding variables of circuit 101.

Processes for formal verification of circuits and other finite-state systems are disclosed herein, which make automated use of indexing relations to generate indexed property assertions on a symbolic lattice domain to represent and verify properties.

For one embodiment, an automated process that uses indexed property assertions on a symbolic lattice domain to represent and verify properties provides an efficient symbolic manipulation technique using binary decision diagrams (BDDs). Disclosed methods for verifying satisfiability may be applicable with respect to property assertions that are symbolically indexed under specific conditions. Such specific conditions may also be automatically checked.

A process is disclosed to provide for significantly reduced computation through automated symbolic indexing of a property assertion and then to directly compute from a symbolic simulation of a model and the indexed property assertion, the satisfiability of the original property assertion by the model. The model may represent a circuit or some other finite state system.

Embodiments of processes for automated verification of indexed property assertions under Boolean constraints symbolically indexed under specific conditions are disclosed. Details of such conditions are provided herein, so that checking of a desired condition may also be automated.

Other methods and techniques are also disclosed herein, which provide for fuller utilization of the claimed subject matter.

While certain exemplary embodiments are described herein and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art upon studying this disclosure. In an area of technology such as this, where growth is fast and further advancements are not easily foreseen, the disclosed embodiments may be readily modifiable in arrangement and detail as facilitated by enabling technological advancements without departing from the principles of the present disclosure or the scope of the accompanying claims.

Notation

To provide a foundation for understanding the description of embodiments of the present invention, use of the following conventional notation is described:

lower case letters (e.g. a, $p_1$ v, x, y) generally represent Boolean variables;

upper case letters (e.g. P, Q) stand for formulas of propositional logic or sets;

$\triangleq$ means equals by definition;

$\supset$ represents logical implication;

¬represents logical negation (NOT);

P[xs] stands for a logic formula that may contain the variables xs;

P[Qs/xs] stands for the result of simultaneously substituting the formulas Qs for all occurrences of the variables xs in the logic formula P;

$a \in A$ means that a belongs to the set A;

if A and C are sets, then A→C stands for the set of all total functions from A to C, and → associates to the right, so A→B→C means A→(B→C);

function application associate to the left so if $f \in$ A→B→C, $a \in A$, and $b \in B$, then $f$ a b means $(f$ a$)$ b;

λx.y represents the function that always returns the value y $\subseteq$ represents the subset relation on sets;

⊑represents a less-than-or-equal order relation for a partially-ordered state space;

(S, ⊑) represents a partial order on S;

x=lub(A) indicates that x is the least upper bound of A, meaning that in the partial order (S, ⊑) where $A \subseteq S$ and $x \in S$ then for all $a \in A$, a ⊑x and x ⊑y for every $y \in S$ such that a ⊑y;

⊔ represents the join relation, and a ⊔ b=lub{a, b} when it exists;

v represents the logical inclusive OR disjunctive operation;

x=glb(A) indicates that x is the greatest lower bound of A, meaning that in the partial order (S, ⊑) where $A \subseteq S$ and $x \in S$ then for all $a \in A$, x ⊑a and y ⊑x for every $y \in S$ such that y ⊑a;

⊓represents the meet relation, and a ⊓b=glb{a, b} when it exists;

∧represents the logical AND conjunction;

if S is finite and for all a, $b \in S$, a ⊔ b and a ⊓b exist, then (S, ⊑) is a complete lattice.

STE Model Checking

The basic form of STE works on a linear-time temporal logic, comprising implications between formulas that include conjunction (AND operations) and a next-time operation. STE is based on ternary simulation, in which the Boolean data domain {0, 1} is extended with a third value, X, that stands for an indeterminate value of 0 or 1, which is unknown.

A symbolic ternary simulation uses binary decision diagrams (BDDs) to represent classes of data values on circuit nodes. With this representation, STE can combine many ternary simulations (one for each assignment of values to the BDD variables) into a single symbolic simulation.

A partial order relation ⊑is introduced to the ternary data model with values {0, 1, X} where X ⊑0 and X ⊑1. The partial order relation is based on information content. Since the specific value of X is not known, the specific values 0 and 1 are greater in the partial order relation than the value X. Therefore the set of ternary circuit node values, D, is {0, 1, X}.

A model of a circuit has a set of observable nodes N. A state is a snapshot of circuit behavior given by an assignment of ternary values to nodes. A state is represented by a function $s \in N \to D$ that maps each node to a ternary value. The ordering relation ⊑on ternary values is extended to an ordering ⊑on state functions N→D, with the addition of a special state, T (called top). The set of states S is therefore defined to be (N→D)∪ {T} and the ordering relation ⊑is defined for states $s_1$ and $s_2$ by $s_1 \sqsubseteq s_2 \triangleq s_2 = T$ or $s_1, s_2 \in (N \to D)$ and $s_1(n) \sqsubseteq s_2(n)$ for all $n \in N$.

The partial order (S,⊑) is a complete lattice. A mathematical theory for STE can be developed for any complete lattice. In practice, sets of states may be represented by state predicates, which are logical formulas incorporating the state variables. In STE, various useful algebraic operations on state predicates may be performed, further details of which are discussed below.

To model dynamic behavior, the values on all circuit nodes, as they evolve over time, may be represented by a function $\sigma \in \mathbb{N} \to S$ from time (represented by the natural numbers, $\mathbb{N}$) to states. Such a function is called a sequence. A sequence assigns a state value to each node at each point in time.

One convenient operation is taking the ith suffix of a sequence:

$\sigma_i \text{tn} \triangleq \sigma(t+i)n$.

The suffix operation $\sigma_i$ (read sigma-sub-i) shifts the sequence σ forward i points in time, ignoring the state associated with the first i time units.

The ordering ⊑is extended point-wise to form lattices of sequences. These inherit the information-content ordering from (S, ⊑). If $\sigma_1 \sqsubseteq \sigma_2$, then $\sigma_1$ can have no more information about node values than $\sigma_2$, and $\sigma_1$ is said to be weaker than $\sigma_2$.

A formal model of a circuit is given by a next-state function $Y \in S \to S$ that maps states to states. Intuitively, the next-state function expresses a constraint on the set of possible states into which the circuit may go, given a constraint on the set of possible states it is in. The next-state function, Y, for STE is monotonic. That is, for all states $s_1$ and $s_2$, $s_1 \sqsubseteq s_2$ implies that $Y(s_1) \sqsubseteq Y(s_2)$.

A sequence σ is said to be in the language of a circuit c if the set of behaviors that the sequence represents (i.e. possibly using unknowns) is a subset of the behaviors that the real circuit can exhibit (where there are no unknowns). The language set $\mathcal{L}(c)$ is defined as follows:

$\mathcal{L}(c) \triangleq \{\sigma | Y(\sigma t) \sqsubseteq \sigma(t+1) \text{ for all } t \geq 0\}$.

A sequence σ in $\mathcal{L}(c)$ is called a trajectory.

A key to the efficiency of STE is its restricted temporal logic. A trajectory formula is a simple linear-time temporal-logic formula with the following core syntax:

| | |
|---|---|
| $f ::= $ n is 0 | node n has value 0; |
| \| n is 1 | node n has value 1; |
| \| $f_1 \wedge f_2$ | conjunction of formulas; |
| \| $P \rightarrow f$ | $f$ is asserted only when P is true; |
| \| $N f$ | $f$ holds in the next time step; | where $f$, $f_1$, and $f_2$ range over formulas; $n \in N$ ranges of the nodes of the circuit; and P is a propositional formula (Boolean function) called a guard. A term 'n is 0' or 'n is 1' means that the node n currently has the value 0 or 1, respectively. The operator $\wedge$(AND) forms the conjunction of trajectory formulas. The term 'P→$f$' restricts the scope of a trajectory formula $f$ by requiring it to be satisfied only when the guard P is true. Finally the term 'N$f$' means that the trajectory formula $f$ holds for the next point of time.

Trajectory formulas are essentially guarded expressions that assert the presence of specific Boolean values on particular circuit nodes. Guards are the only place that variables may occur in the primitive definition of trajectory formulas. In order to associate a variable or a propositional formula with a node, the following syntactic construction is defined:

$$n \text{ is } P \stackrel{def}{=} P \rightarrow (n \text{ is } 1) \wedge \neg P \rightarrow (n \text{ is } 0) \quad (1)$$

where $n \in N$ ranges over nodes and P ranges over propositional formulas.

When an assignment $\phi$ (phi) of Boolean values to the variables of a formula P satisfies the formula P, it is denoted $\phi \models P$. What it means to say that a sequence $\sigma$ satisfies a trajectory formula $f$ with respect to an assignment $\phi$ of Boolean values to the variables in the guard of the formula may be defined as follows:

$\phi, \sigma \models n$ is $0 \stackrel{def}{=} \sigma(0) = T$, or $\sigma(0) \in (N \rightarrow D)$ and $\sigma 0 n = 0$;

$\phi, \sigma \models n$ is $1 \stackrel{def}{=} \sigma(0) = T$, or $\sigma(0) \in (N \rightarrow D)$ and $\sigma 0 n = 1$;

$\phi, \sigma \models f_1 \wedge f_2 \stackrel{def}{=} \phi, \sigma \models f_1$ and $\phi, \sigma \models f_2$;

$\phi, \sigma \models P \rightarrow f \stackrel{def}{=} \phi \models$ implies $\phi, \sigma \models f$;

$\phi, \sigma \models N f \stackrel{def}{=} \phi, \sigma_1 \models f$;

For any trajectory formula $f$ there exists a unique weakest sequence that satisfies $f$. This unique weakest sequence is called the defining sequence for $f$ and may be defined recursively as follows:

$[m \text{ is } 0]^\phi \text{tn} \stackrel{def}{=} 0$ whenever m=n and t=0, otherwise X;

$[m \text{ is } 1]^\phi \text{tn} \stackrel{def}{=} 1$ whenever m=n and t=0, otherwise X;

$[f_1 \wedge f_2]^\phi t \stackrel{def}{=} ([f_1]^\phi t) \sqcup ([f_2]^\phi t)$;

$[P \rightarrow f]^\phi t \stackrel{def}{=} [f]^\phi t$ whenever $\phi \models P$, otherwise $\lambda n.X$;

$[N f]^\phi t \stackrel{def}{=} [f]^\phi (t-1)$ whenever $t \neq 0$, otherwise $\lambda n.X$.

The crucial property enjoyed by this definition is that $[f]^\phi$ is the unique weakest sequence that satisfies $f$. That is to say that a sequence $a$ satisfies a formula $f$ with respect to an assignment $\phi$ of Boolean values to the variables of the formula (denoted $\phi, \sigma \models f$) if and only if $[f]^\phi \sqsubseteq \sigma$.

The weakest trajectory that satisfies a formula $f$ is called the defining trajectory for the formula. It is defined with respect to the formula's defining sequence $[f]^\phi$ together with added constraints on state transitions imposed by the circuit as modeled by the next state function Y. The defining trajectory may be defined as follows:

$[f]^\phi 0 \stackrel{def}{=} [f]^\phi 0$;

$[f]^\phi(t+1) \stackrel{def}{=} [f]^\phi(t+1) \sqcup Y([f]^\phi t)$.

It can be shown that $[f]^\phi$ is the unique weakest trajectory that satisfies $f$ with respect to an assignment $\phi$. That is to say that a sequence $\sigma$ in the language of the circuit $\mathcal{L}(c)$ (i.e. a trajectory) satisfies a formula $f$ with respect to an assignment $\phi$ of Boolean values to the variables of the formula (denoted $\phi, \sigma \models f$) if and only if $[f]^\phi \sqsubseteq \sigma$.

Circuit correctness in STE may be stated with trajectory assertions of the form A ⇒ C, where A and C are trajectory formulas. Intuitively, the antecedent A provides stimuli to circuit nodes and the consequent C specifies the values expected on circuit nodes as a response.

A trajectory assertion is true for a given assignment $\phi$ of Boolean values to variables when every sequence $\sigma$ in the language of the circuit $\mathcal{L}(c)$ (i.e. every trajectory) that satisfies the antecedent A, also satisfies the consequent C, which is denoted $\phi \models A \Rightarrow C$ and defined as follows:

$\phi \models A \Rightarrow C \stackrel{def}{=} \phi, \sigma \models A$ implies $\phi, \sigma \models C$, for all $\sigma \in \mathcal{L}(c)$;

$\models A \Rightarrow C \stackrel{def}{=} \phi \models A \Rightarrow C$, for all $\phi$.

The fundamental theorem of trajectory evaluation states that for any assignment $\phi$ of Boolean values to variables, the trajectory assertion $\phi \models A \Rightarrow C$ holds exactly when $[C]^\phi \sqsubseteq [A]^\phi$. Intuitively, the sequence characterizing the consequent must be "in" the weakest sequence consistent with the circuit and satisfying the antecedent. The theorem gives an efficient model-checking algorithm for trajectory assertions. Moreover, STE can compute $[C]^\phi \sqsubseteq [A]^\phi$ not just for a specific assignment $\phi$ of Boolean values, but as a constraint on an arbitrary assignment of Boolean values (i.e. as a BDD). Such a constraint is called a residual, and represents the precise conditions under which the property, specified by the trajectory assertion A⇒C, holds.

Symbolic Indexing in STE

Two important properties follow from the STE theory. First, consider an STE assertion A⇒C. If the antecedent A is replaced with a new antecedent $A_w$ such that the defining sequence is no stronger than that of A (i.e. $[A_w]^\phi \sqsubseteq [A]^\phi$ for all $\phi$) and $\models A_w \Rightarrow C$ holds, then the original assertion $\models A \Rightarrow C$ also holds. This is called antecedent weakening.

Now consider replacing the consequent C with a new consequent $C_s$ such that the defining sequence is no weaker than that of C (i.e. $[C]^\phi \sqsubseteq [C_s]^\phi$ for all $\phi$) and $\models A_w \Rightarrow C_s$ holds, then the original assertion $\models A \Rightarrow C$ also holds. This is called consequent strengthening.

Symbolic indexing is a systematic use of antecedent weakening to perform data abstraction for regular circuit structures. It exploits the partially-ordered state space of STE to reduce complexity of the BDDs needed to verify a circuit property.

For example, FIG. 1 illustrates a simple circuit 101. Circuit 101 includes an AND gate 102 with three inputs, a, b, and c and one output o. An STE assertion using the syntactic construction of (1) to verify this device is given by:

$\models (a \text{ is } a) \wedge (b \text{ is } b) \wedge (c \text{ is } c) \Rightarrow (o \text{ is } a \wedge b \wedge c)$.

In the more primitive form, this may be expressed as follows:

⊨(¬a→(a is 0))∧(a→(a is 1))∧

(¬b→(b is 0))∧(b→(b is 1))∧

(¬c→(c is 0))∧(c→(c is 1))

⇒(¬a∨¬b∨¬c→(o is 0))∧(a∧b∧c→(o is 1)).

The strategy is to place unique and unconstrained Boolean variables onto each input node in the device and symbolically simulate the circuit to check that the desired function of these variables will appear on the output node.

FIG. 2a illustrates all sixteen of the Boolean possibilities for the set, {a, b, c, o}. The set of possibilities 201 corresponds to possibilities, which may result from a symbolic simulation of circuit 101 using the input values specified by the antecedent of the assertion (¬a→(a is 0))∧(a→(a is 1))∧

(¬b→(b is 0))∧(b→(b is 1))∧

(¬c→(c is 0))∧(c→(c is 1)).

The set of possibilities 202, on the other hand, corresponds to possibilities, which would not result from a symbolic simulation of circuit 101. The set of possibilities 201 also corresponds to the possibilities defined by the consequent of the assertion, (¬a∨¬b∨¬c→(o is 0))∧(a∧b∧c→(o is 1)), and therefore the assertion is satisfied.

In the AND gate example of circuit 101, STE's unknown value X allows us to reduce the number of possibilities needed to verify the desired property assertion, to just four cases as illustrated by FIG. 2b. The set of possibilities 203 corresponds to weakened lattice valued possibilities, which may result from a symbolic simulation of circuit 101 using the set of circuit node values, D. If all three inputs are 1, then the output is 1 as well. But if at least one of the inputs is 0, then the output will be 0 regardless of the values on the other two inputs. In these cases the lattice value, X, may be used to represent the unknown value present on the other two input nodes. The four enumerated cases 211-214 of the set of possibilities 203 cover all input patterns of 0s and 1s shown in FIG. 2a. Therefore, because of the properties of antecedent weakening, these four cases are sufficient for a complete verification of the assertion for circuit 101.

Symbolic indexing is a technique using Boolean variables to enumerate or index groups of cases in this way. For example, the four cases of the set of possibilities 203, may be indexed as shown using two Boolean variables, p and q. These cases can then be verified with STE by checking the following assertion:

⊨(¬p∧¬q→(a is 0))∧(p∧q→(a is 1))∧

(¬p∧q→(b is 0))∧(p∧q→(b is 1))∧

(p∧¬q→(c is 0))∧(p∧q→(c is 1))

⇒(¬p∨¬q→(o is 0))∧(p∧q→(o is 1)).

According to the properties of antecedent weakening, whenever the above formula allows an input circuit node to be the unknown value, X, that node could have been set to either 0 or 1 and the input/output relation verified would still hold.

Symbolic indexing provides for a reduction in the number of variables needed to verify a property assertion. By applying antecedent weakening to a model, an indexed model may be generated and used to compute a symbolic simulation. In the AND gate example of circuit 101, three variables are reduced to two variables. In general, more substantial reductions may be possible and symbolic indexing may provide for verification of circuits that can not be verified directly. Memory structures are one example of such circuits that arise in practice It will be appreciated that manually indexing large complex circuits is tedious and that the probability of introducing errors into the representation is relatively high. Moreover, new indexing schemes may be needed to efficiently verify each new property assertion and/or circuit partition.

Symbolic indexing may be automated through the application of an indexing relation of the form R(xs, ts). The indexing relation R relates variables as appearing in the original property assertion to index variables xs that will index the cases being grouped together by the abstraction. The original variables ts are called index target variables.

In the AND gate example of circuit 101, one embodiment of an indexing relation R may be specified as follows:

$$R(p, q, a, b, c) = (\neg p \land \neg q \supset \neg a)$$

$$\land (\neg p \land q \supset \neg b)$$

$$\land (p \land \neg q \supset \neg c)$$

$$\land (p \land q \supset a \land b \land c).$$

The above indexing relation is not one-to-one (for example, the case when a=0, b=0, c=0 is indexed by any combination of p and q except when p=1 and q=1), but other indexing relations may be one-to-one.

One embodiment of a preimage operation to facilitate automatic symbolic indexing may be performed for an indexing relation R(xs, ts) and a state predicate P(ts) on the target variables ts as follows:

$$P_R \overset{\text{def}}{=} \exists ts.R(xs, ts) \land P(ts).$$

An operation ∃ts.P(ts) represents a quantification of a state predicate P(ts) over the variables ts.

Hence the preimage is a predicate $P_R(xs)$ that holds for index values of xs precisely when they index the target values ts for which P(ts) holds.

By way of example, a preimage operation to facilitate automatic symbolic indexing may be performed for the indexing relation R(p, q, a, b, c) and the guard of a formula, ¬b→(b is 0), from the antecedent of the AND gate example circuit 101 as follows:

$$P_R = \exists a, b, c.\ R(p, q, a, b, c) \land \neg b$$

$$= \exists a, b, c.\ [(\neg p \land \neg q \supset \neg a) \land (\neg p \land q \supset \neg b) \land (p \land \neg q \supset \neg c) \land$$

$$(\neg (p \land q) \lor a \land b \land c)] \land \neg b$$

$$= \exists b, a, c.\ [(p \lor q \lor \neg a) \land (p \lor \neg q \lor \neg b) \land (\neg p \lor q \lor \neg c) \land$$

$$(\neg p \lor \neg q \lor (a \land b \land c))] \land \neg b$$

$$= \exists a, c.\ [(p \lor q \lor \neg a) \land (p \lor \neg q \lor \neg T) \land (\neg p \lor q \lor \neg c) \land$$

$$(\neg p \lor \neg q \lor (a \land T \land c))] \land \neg T \lor$$

-continued $$[(p \vee q \vee \neg a) \wedge (p \vee \neg q \vee \neg F) \wedge (\neg p \vee q \vee \neg c) \wedge$$
$$(\neg p \vee \neg q \vee (a \wedge F \wedge c))] \wedge \neg F$$
$$= \exists a, c. \ (p \vee q \vee \neg a) \wedge (\neg p \vee q \vee \neg c) \wedge (\neg p \vee \neg q)$$
$$= \exists c.(p \vee q \vee \neg T) \wedge (\neg p \vee q \vee \neg c) \wedge (\neg p \vee \neg q) \vee$$
$$(p \vee q \vee \neg F) \wedge (\neg p \vee q \vee \neg c) \wedge (\neg p \vee \neg q)$$
$$= \exists c.(\neg p \vee q \vee \neg c) \wedge (\neg p \vee \neg q)$$
$$= (\neg p \vee q \vee \neg T) \wedge (\neg p \vee \neg q) \vee (\neg p \vee q \vee \neg F) \wedge (\neg p \vee \neg q)$$
$$= (\neg p \vee \neg q).$$

A partitioned indexing relation, R(xs, ts), on a partitioning of state variables $ts=\{ts_1, ts_2, \ldots, ts_k\}$ has the implicitly conjoined form:

$$R(xs, ts)=R(xs, ts_1) \wedge R(xs, ts_2) \wedge \ldots R(xs, ts_k).$$

It will be appreciated by those skilled in the art that in order to more efficiently use computational resources, preimage computations may be carried out as relational products of state predicates using early variable quantification for partitioned indexing relations, thereby permitting staged reductions of Boolean expressions. One embodiment of a preimage operation to facilitate automatic symbolic indexing may be performed for a partitioned indexing relation R(xs, ts) and a state predicate P(ts) on partitioned target variables $ts=\{ts_i, ts_j\}$ as follows:

$$P_R \stackrel{\text{def}}{=} \exists ts_i.R(xs, ts_i) \wedge (\exists ts_j.[R(xs, ts_j) \wedge P(ts_i, ts_j)]).$$

It will be appreciated that other quantification methods may also be applicable.

One embodiment of a strong preimage operation to facilitate automatic symbolic indexing may be performed for an indexing relation R(xs, ts) and a state predicate P(ts) on the target variables ts as follows:

$$P^R \stackrel{\text{def}}{=} P_R \wedge \neg [\exists ts.R(xs, ts) \wedge \neg P(ts)].$$

The strong preimage is a predicate $P^R(xs)$ that holds for index values of xs precisely when they index the target values ts for which P(ts) holds but for which ¬P(ts) does not hold. In other words, $P^R(xs)$ holds for index values of xs that are in the preimage of P but not in the preimage of the negation of P (i.e. the relative complement of the preimage of the negation of P in the preimage of P).

For example, applying a strong preimage operation for the indexing relation R(p, q, a, b, c) and the guard of a formula, ¬b→(b is 0), from the AND gate example as follows:

$$P^R = P_R \wedge \neg [\exists a, b, c.R(p, q, a, b, c) \wedge \neg (\neg b)]$$
$$= P_R \wedge \neg [\exists b, a, c.(p \vee q \vee \neg a) \wedge (p \vee \neg q \vee \neg b) \wedge (\neg p \vee q \vee \neg c)$$
$$\wedge (\neg p \vee \neg q \vee (a \wedge b \wedge c)) \wedge b]$$
$$= P_R \wedge \neg [\exists a, c.(p \vee q \vee \neg a) \wedge (p \vee \neg q) \wedge (\neg p \vee q \vee \neg c)$$
$$\wedge (\neg p \vee \neg q \vee (a \wedge c))]$$
$$= P_R \wedge \neg [\exists c.p \wedge (q \vee \neg c) \wedge (\neg q \vee c) \vee \neg q \wedge (\neg p \vee \neg c)]$$
$$= P_R \wedge \neg (p \vee \neg q)$$
$$= P_R \wedge (\neg p \wedge q)$$
$$= (\neg p \vee \neg q) \wedge (\neg p \wedge q)$$
$$= (\neg p \wedge \neg p \wedge q) \vee (\neg q \wedge \neg p \wedge q)$$
$$= \neg p \wedge q.,$$

automatically produces a strong preimage $P^R(p, q) = \neg p \wedge q \rightarrow$ (b is 0) for the indexing relation R(p, q, a, b, c) and the formula, ¬b →(b is 0). Thus using an embodiment of a strong preimage operation as describrd, automated application of the indexing relation R to the guards of trajectory predicate A may be performed resulting in an indexed antecedent trajectory. Intuitively, by applying a strong preimage operation to automate antecedent weakening, an indexed model may be generated and used to compute a symbolic simulation.

It will also be appreciated that strong preimage computations may be carried out similarly to other preimage computations, as relational products of state predicates using early variable quantification for partitioned indexing relations.

For one embodiment of automatic symbolic indexing, preimage and strong preimage operations may be applied to the guards of antecedent and consequent formulas. One embodiment of the preimage and strong preimage of STE formulas may be recursively defined as follows:

$$(n \text{ is } 0)_R \stackrel{\text{def}}{=} n \text{ is } 0 \qquad (n \text{ is } 0)^R \stackrel{\text{def}}{=} n \text{ is } 0$$
$$(n \text{ is } 1)_R \stackrel{\text{def}}{=} n \text{ is } 1 \qquad (n \text{ is } 1)^R \stackrel{\text{def}}{=} n \text{ is } 1$$
$$(f \wedge g)_R \stackrel{\text{def}}{=} f_R \wedge g_R \qquad (f \wedge g)^R \stackrel{\text{def}}{=} f^R \wedge g^R$$
$$(P \rightarrow f)_R \stackrel{\text{def}}{=} P_R \rightarrow f_R \qquad (P \rightarrow f)^R \stackrel{\text{def}}{=} P^R \rightarrow f^R$$
$$(Nf)_R \stackrel{\text{def}}{=} Nf_R \qquad (Nf)^R \stackrel{\text{def}}{=} Nf^R$$

For an indexing relation R, applying the strong preimage operation to the guard of an STE formula $f$ is a weakening operation, i.e.

for all $\phi$, if $\phi \vDash R$, then $[f^R]^\phi \sqsubseteq [f]^\phi$.

This means that the defining sequence of $f$ has no less information about node values than the weak defining sequence of $f^R$, under the assumption that the indexing relation R holds.

For an indexing relation R, applying the preimage operation to the guard of an STE formula $f$ is a strengthening operation, i.e.

for all $\phi$, if $\phi \vDash R$, then $[f]^\phi \sqsubseteq [f_R]^\phi$.

This means that the defining sequence of $f$ has no more information about node values than the strong defining sequence of $f_R$, under the assumption that the indexing relation R holds.

Intuitively, the application of an indexing relation to an arbitrary property assertion A ⇒C may be automated through an embodiment of a strong preimage operation and an embodiment of a preimage operation, weakening the antecedent A and strengthening the consequent C with the same indexing relation R. If the resulting STE assertion $A^R$ ⇒$C_R$ holds then it can be concluded that the original STE assertion also holds.

The indexed assertion $A^R$ ⇒$C_R$ may be verified through symbolic simulation under an assumption that the indexing relation R completely covers the target variables. In other words, for any choice of target variables, there should exist an assignment to the index variables that indexes that choice. The afore mentioned condition may be written, ∃ ts. R(xs, ts). To guarantee the soundness of such a simulation approach, checking of this side condition and of other possible side conditions may optionally be automated.

Figure 3:
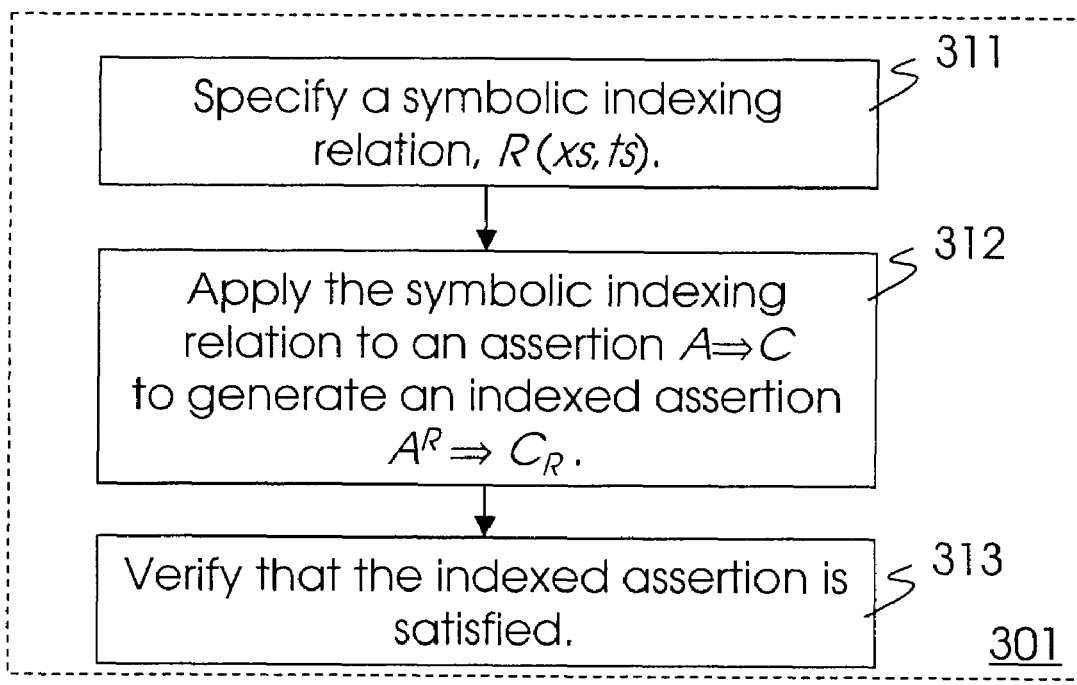
FIG. 3 diagrams one embodiment of a process for symbolic indexing of an assertion for formal verification.

FIG. 3 diagrams one embodiment of a process 301 for symbolic indexing of an assertion for formal verification. Process 301 and other processes herein disclosed are performed by processing blocks that may comprise dedicated hardware or software or firmware operation codes executable by general purpose machines or by special purpose machines or by a combination of both.

In processing block 311 a symbolic indexing relation R(xs, ts) is specified. Processing continues in processing block 312 where an indexed property assertion $A^R \Rightarrow C_R$ is generated through the application of the indexing relation to a property assertion $A \Rightarrow C$. Processing then proceeds in processing block 313 where the indexed property assertion $A^R \Rightarrow C_R$ is verified through symbolic simulation to see if it is satisfied. Assuming that symbolic indexing relation R(xs, ts) covers the target variables, ts, it is sound to conclude that the original property assertion $A \Rightarrow C$ also holds.

Figure 4:
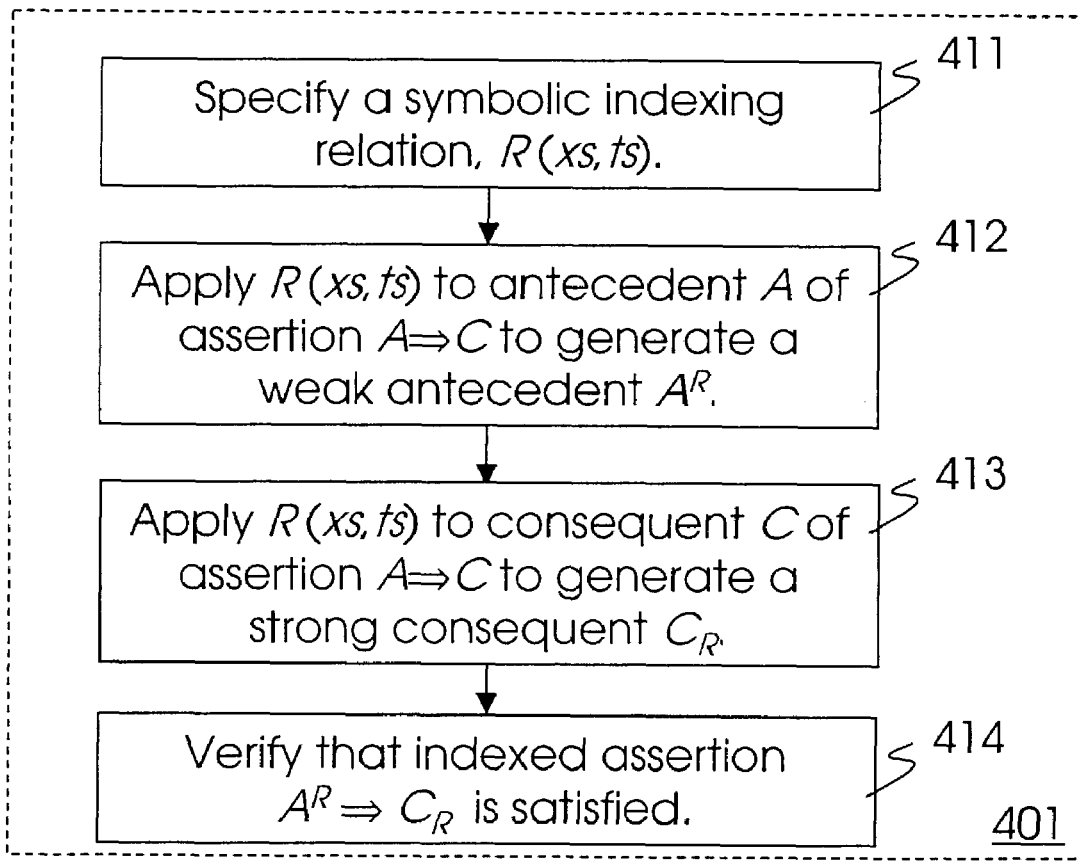
FIG. 4 diagrams an alternative embodiment of a process for symbolic indexing of an assertion for formal verification.

FIG. 4 diagrams an alternative embodiment of a process 401 for symbolic indexing of an assertion for formal verification. In processing block 411 a symbolic indexing relation R(xs, ts) is specified. Processing continues in processing block 412 where weak antecedent $A^R$ is generated through the application of the indexing relation to the antecedent A of a property assertion $A \Rightarrow C$. Processing continues in processing block 413 where strong consequent $C_R$ is generated through the application of the indexing relation to the consequent C of property assertion $A \Rightarrow C$. Processing then proceeds in processing block 414 where the indexed property assertion $A^R \Rightarrow C_R$ is verified through symbolic simulation to see if it is satisfied. If the symbolic indexing relation R(xs, ts) covers the target variables, ts, property assertion $A \Rightarrow C$ also holds.

Figure 5:
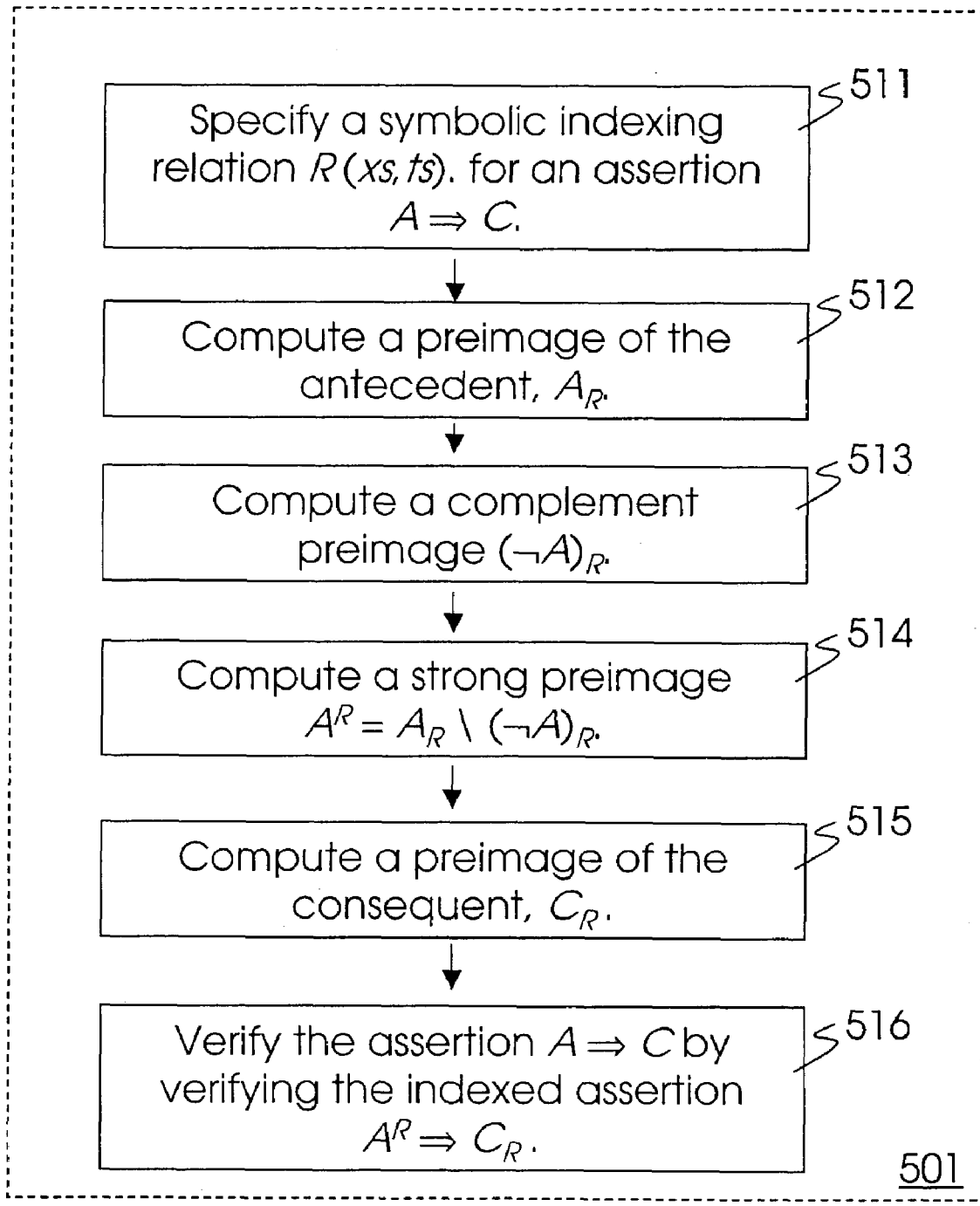
FIG. 5 diagrams another alternative embodiment of a process for symbolic indexing of an assertion for formal verification.

FIG. 5 diagrams another alternative embodiment of a process 501 for symbolic indexing of an assertion for formal verification. In processing block 511 a symbolic indexing relation R(xs, ts) is specified for a property assertion $A \Rightarrow C$. Processing continues in processing block 512 where a preimage of the antecedent $A_R$ is computed. Processing continues in processing block 513 where a complement preimage of the antecedent $(\neg A)_R$ is computed. Processing proceeds in processing block 514 where a strong preimage of the antecedent $A^R$ is computed, containing all states in the preimage $A_R$ but not in the complement preimage $(\neg A)_R$, denoted $A_R \setminus (\neg A)_R$. Processing continues in processing block 515 where a preimage of the consequent $C_R$ is computed. Processing then proceeds in processing block 516 where, under the assumption that the symbolic indexing relation R(xs, ts) covers the target variables, ts, the property assertion $A \Rightarrow C$ is verified by verifying an indexed property assertion $A^R \Rightarrow C_R$ through symbolic simulation.

Figure 6:
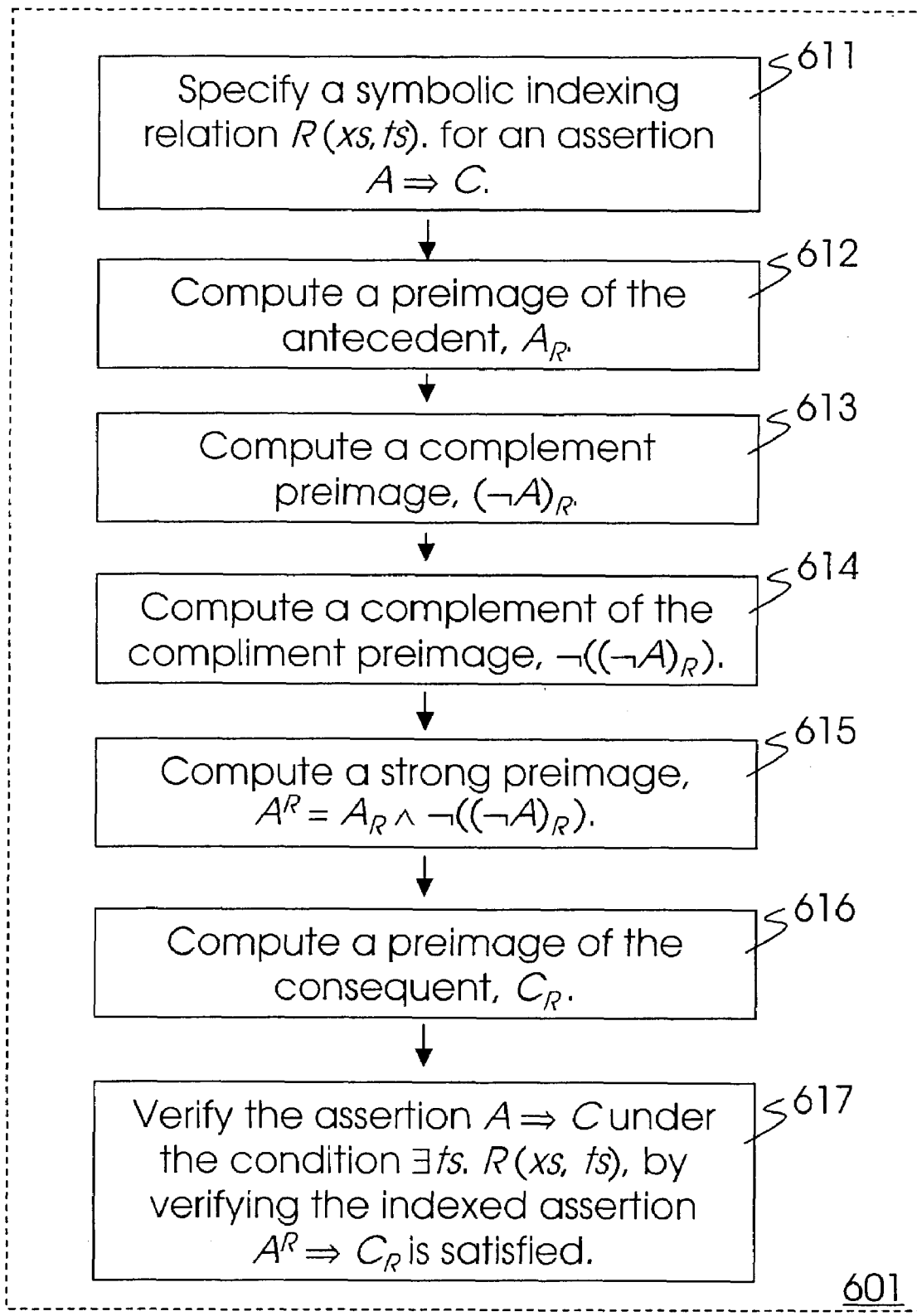
FIG. 6 diagrams another alternative embodiment of a process for symbolic indexing of an assertion for formal verification.

FIG. 6 diagrams another alternative embodiment of a process 601 for symbolic indexing of an assertion for formal verification. In processing block 611 a symbolic indexing relation R(xs, ts) is specified for a property assertion $A \Rightarrow C$. Processing continues in processing block 612 where a preimage of the antecedent $A_R$ is computed. Processing continues in processing block 613 where a complement preimage of the antecedent $(\neg A)_R$ is computed. Processing proceeds in processing block 614 where a complement of the complement preimage, $\neg((\neg A)_R)$ is computed. Processing continues in processing block 615 where the conjunction of the preimage and complemented complement preimage $A_R \wedge \neg((\neg A)_R)$ is computed. Processing proceeds in processing block 616 where a preimage of the consequent $C_R$ is computed. Finally, in processing block 617, property assertion $A \Rightarrow C$ is verified under the assumption, ∃ ts. R(xs, ts), by verifying an indexed property assertion $A^R \Rightarrow C_R$ through symbolic simulation to see if it is satisfied.

Figure 7:
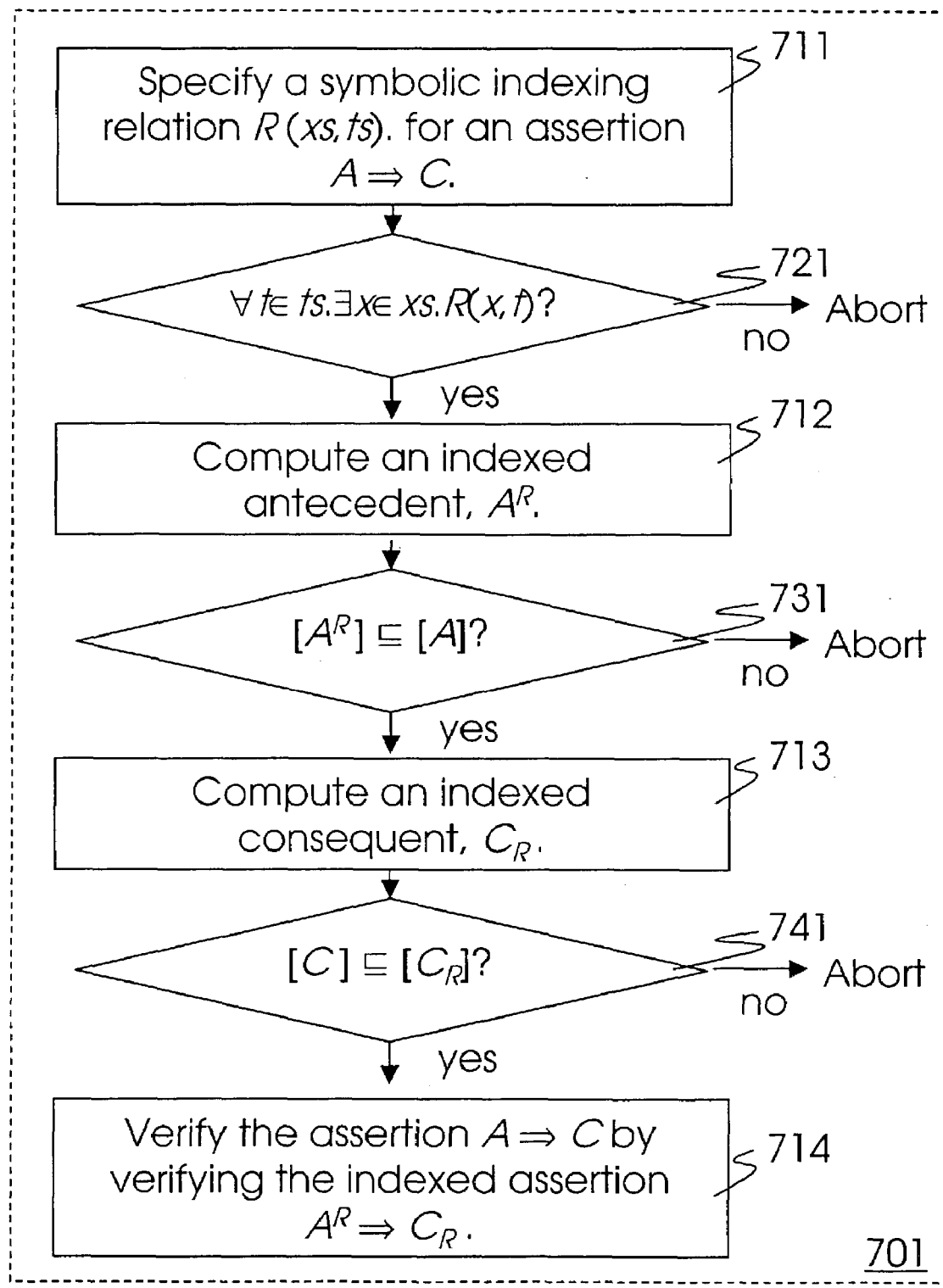
FIG. 7 diagrams another alternative embodiment of a process for symbolic indexing of an assertion for formal verification.

FIG. 7, diagrams another alternative embodiment of a process 701 for symbolic indexing of an assertion for formal verification. In processing block 711 a symbolic indexing relation R(xs, ts) is specified for a property assertion $A \Rightarrow C$. In processing block 721 an optional checking of the condition, ∃ ts. R(xs, ts), that the indexing relation R(xs, ts) completely covers the target variables ts, is performed. As described above, for any t of target variables ts, there should exists an assignment to the index variables xs that indexes it. If the condition does not hold in processing block 721, process 701 may be aborted.

Otherwise, processing continues in processing block 712 where an indexed antecedent $A^R$ is computed. In processing block 731 an optional checking that the indexed antecedent $A^R$ is at least as weak as the antecedent A is performed. If the indexed antecedent is computed through a strong preimage computation as described above, then by construction the condition of processing block 731 will be satisfied. If the condition does not hold in processing block 731, process 701 may be aborted. Otherwise, processing continues in processing block 713 where an indexed consequent $C_R$ is computed. In processing block 741 an optional checking that the indexed consequent $C_R$ is at least as strong as the consequent C is performed. If the indexed consequent is computed through a preimage computation as described above, then by construction the condition of processing block 741 will also be satisfied. If the condition does not hold in processing block 741, process 701 may be aborted. Otherwise, processing proceeds in processing block 714 where under the assumption, ∃ ts. R(xs, ts), the property assertion $A \Rightarrow C$ is verified by verifying an indexed property assertion $A^R \Rightarrow C_R$ through symbolic simulation.

Figure 8:
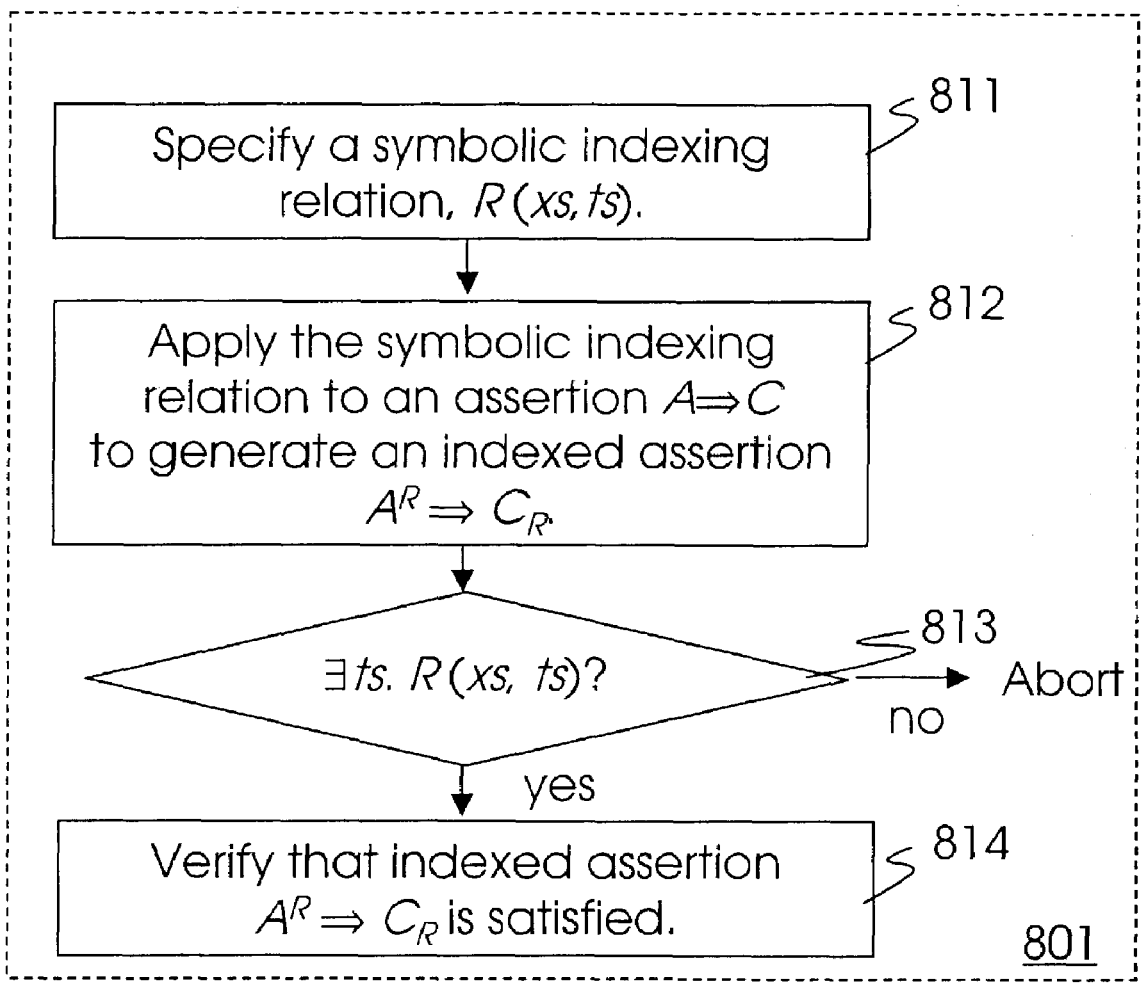
FIG. 8 diagrams another alternative embodiment of a process for symbolic indexing of an assertion for formal verification.

FIG. 8 diagrams another alternative embodiment of a process 801 for symbolic indexing of an assertion for formal verification. In processing block 811 a symbolic indexing relation R(xs, ts) is specified. Processing continues in processing block 812 where an indexed property assertion $A^R \Rightarrow C_R$ is generated through the application of the indexing relation to a property assertion $A \Rightarrow C$. In processing block 813 an optional checking of the coverage condition, ∃ ts. R(xs, ts), of the symbolic indexing relation is performed. If the condition does not hold in processing block 813, process 801 may be aborted. Otherwise, processing proceeds in processing block 814 where the indexed property assertion $A^R \Rightarrow C_R$ is verified through symbolic simulation to see if it is satisfied.

Verification often takes place in the presence of environmental constraints and operating assumptions. One embodiment of automatic symbolic indexing exploits such constraints and/or assumptions through parametric representation of state predicates. Parametric representation of constraints may provide for reductions in computational complexity by restricting verification to a particular set of inputs.

For example, consider a predicate P that constrains a set of variables ys. The desired behavior of a circuit is expressed by the property assertion $A \Rightarrow C$ over the same variables ys, which needs to hold only under the constraint P. It is desirable to verify that for any assignment $\phi$ that satisfies P (denoted $\phi \models P$), the assignment $\phi$ also satisfies the property assertion (denoted $\phi \models A \Rightarrow C$). One way to do this is to use STE to obtain a residual from $\phi \models A \Rightarrow C$ and check that P implies the residual. Unfortunately, obtaining a residual by directly computing $\phi \Rightarrow A \Rightarrow C$ with a symbolic simulator may be impractical.

A better way is to evaluate $\phi \models A \Rightarrow C$ only for the variable assignments $\phi$ that satisfy P. Parametric representation does this by direct encoding of a care predicate implicitly by parametric functions Qs that are substituted for the variables ys to compute $\Rightarrow A[Qs/ys] \Rightarrow C[Qs/ys]$.

For example, FIG. 9 illustrates a parameterized constraint for four input variables. Consider constraining four input variables a, b, c and d to a set of input vectors S={1001, 1000, 0101}. A non-minimized predicate P that constrains the variables to values in S is given by $P=(a \wedge \neg b \wedge \neg c \wedge d)$ $\vee (a \wedge \neg b \wedge \neg c \wedge \neg d) \vee (\neg a \wedge b \wedge \neg c \wedge d)$. The term $\neg a \wedge b \wedge \neg c \wedge d$ corresponds to input values 911 or 912. The term $a \wedge \neg b \wedge \neg c \wedge \neg d$ corresponds to input values 913 and the term $a \wedge \neg b \wedge \neg c \wedge d$ corresponds to input values 914.

Thus, the same set of values can be parameterized using parametric representation 901 with parametric variables r and s as shown. Parametric representation replaces the set of input variables {a, b, c, d} with the parametric functions $Qs=\{r, \neg r, 0, \neg r \vee s\}$. It will be appreciated that, in general, other parametric representations may be possible when the predicate P is satisfiable, for example, $Qs=\{\neg r \vee \neg s, r \wedge s, 0, r\}$ could also be used to parameterize the set of values.

Details of an automated procedure for generating a parametric representations is presented by Mark D. Aagaard et al., "Formal Verification Using Parametric Representations of Boolean Constraints," Proceedings of the 36th ACM/IEEE Design Automation Conference, June 1999.

One embodiment of direct parametric encoding through automatic indexing is to apply an indexing relation R to the verification that includes a constraint P. A parametrically encoded assertion $A[P] \Rightarrow C[P]$ and a parametrically encoded indexing relation R[P] are computed. Application of parametrically encoded indexing relation is automated through an embodiment of a strong preimage operation and an embodiment of a preimage operation, weakening the parametrically encoded antecedent A[P] and strengthening the parametrically encoded consequent C[P] with the indexing relation R[P]. If the resulting STE assertion $A[P]^R \Rightarrow C[P]_R$ holds then it can be concluded that the original STE assertion holds under the constraint P.

Figure 10:
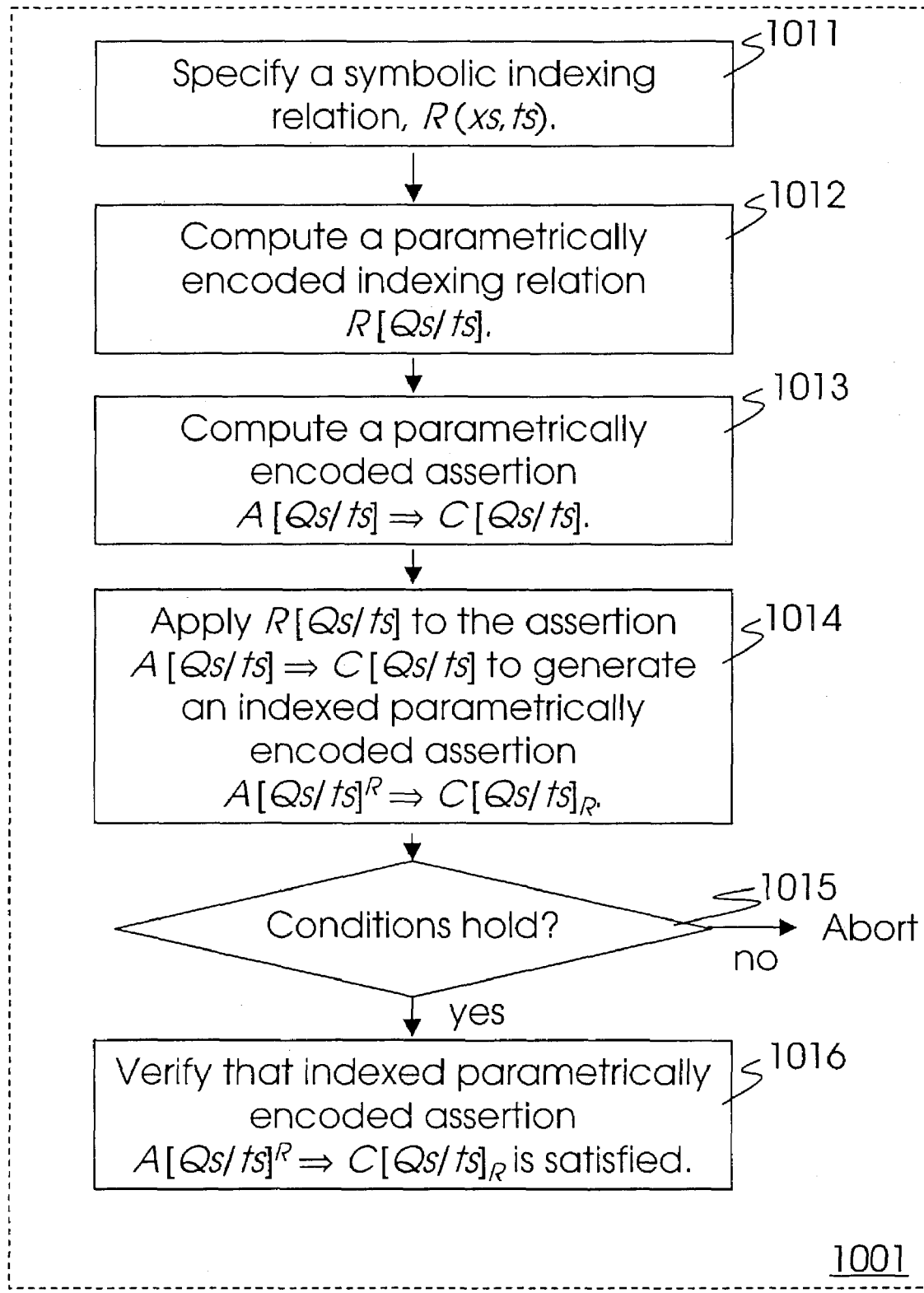
FIG. 10 diagrams one embodiment of a process for symbolic indexing of a parametrically encoded assertion for formal verification.

FIG. 10 diagrams one embodiment of an automated process 1001 for symbolic indexing of a parametrically encoded assertion for formal verification. In processing block 1011, a symbolic indexing relation R(xs, ts) is specified. Processing continues in processing block 1012 where a parametric encoding of the indexing relation R[Qs/ts] is computed. Processing then proceeds to processing block 1013 where a parametric encoding of the property assertion $A[Qs/ts] \Rightarrow C[Qs/ts]$ is computed. Processing continues in processing block 1014 where an indexed parametrically encoded property assertion $A[Qs/ts]^R \Rightarrow C[Qs/ts]_R$ is generated through the application of the parametrically encoded indexing relation to the parametrically encoded property assertion.

In similarity to what has been described above, whether a property assertion can be verified through a symbolic simulation of an indexed parametrically encoded property assertion may depend on whether specific side conditions hold, further details of which are discussed below. Therefore, in processing block 1015, a check may be performed to determine if the set of side conditions hold. If not, process 1001 may be aborted. Otherwise, if the side conditions hold, processing may proceed in processing block 1016 where the indexed parametrically encoded property assertion is verified through symbolic simulation to see if it is satisfied. Assuming that parametrically encoded indexing relation R[Qs/ts] covers the new parametric target variables, it is sound to conclude that the original property assertion $A \Rightarrow C$ also holds.

It will be appreciated by those skilled in the art that computing a parametrically encoded indexing relation R[Qs/ts] may be computationally infeasible for some verification problems.

Hence, an alternative embodiment of parametrically encoding residuals through automatic indexing is to apply an indexing relation R(xs, ts) to the predicate P to compute the preimage $P_R$. The assertion $A \Rightarrow C$ is also automatically indexed and symbolically simulated to compute an indexed residual predicate Q(xs). If $P_R \supset Q(xs)$ can be verified and a set of side conditions hold, then it can be concluded that the original STE assertion holds under the constraint P.

Figure 11:
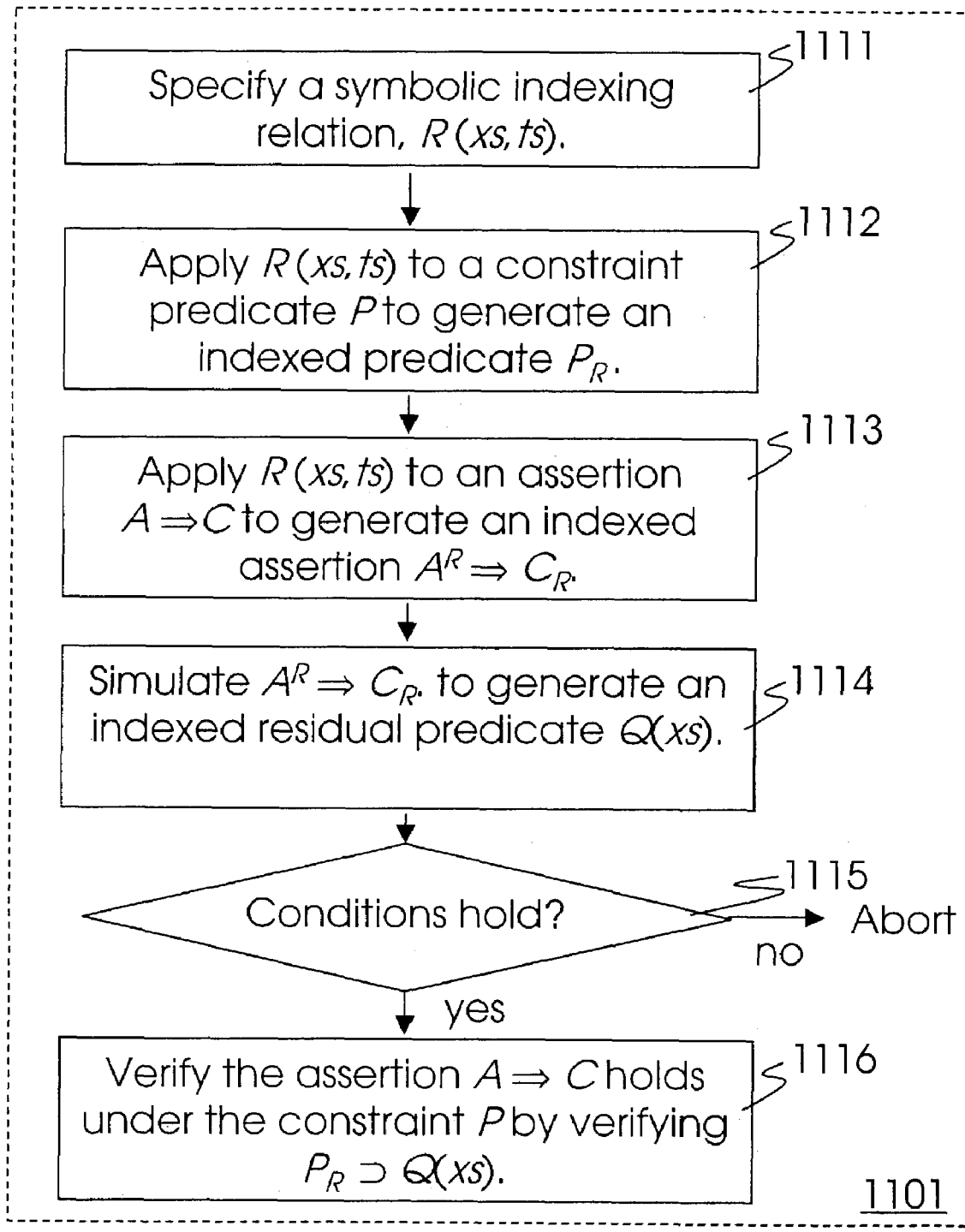
FIG. 11 diagrams one embodiment of a process for symbolic indexing of a constraint predicate and an assertion for formal verification.

FIG. 11 diagrams one embodiment of an automated process 1101 for symbolic indexing of a constraint predicate and an assertion for formal verification. In processing block 1111, a symbolic indexing relation R(xs, ts) is specified. Processing continues in processing block 1112 where an indexed predicate $P_R$ is generated by applying the indexing relation R(xs, ts) to a constraint predicate F. Processing then proceeds to processing block 1113 where an indexed property assertion $A^R \Rightarrow C_R$ is generated through the application of the indexing relation R(xs, ts) to the property assertion $A \Rightarrow C$. Processing then proceeds to processing block 1114 where the indexed property assertion $A^R \Rightarrow C_R$ is symbolically simulated to generate a residual predicate Q(xs).

In processing block 1115, a check may be performed to determine if a set of side conditions hold. One side condition that may need to be checked is that the preimage $P_R$ and the preimage $(\neg P)_R$ should be disjoint, making $P_R = P^R$. One way to ensure this condition is make the preimage $(\neg P)_R$ empty. This can be accomplished by restricting the indexing relation R from indexing anything in $\neg P$.

Another side condition that may need to be checked is that the indexing relation should cover all values of the target variables that satisfy P. By choosing an indexing relation R that exactly partitions P, both of these side conditions can be satisfied.

If the conditions do not hold in processing block 1115, process 1101 may be aborted. Otherwise, processing may proceed in processing block 1116 where the property assertion $A \Rightarrow C$ is verified under the constraint predicate P by verifying that the residual predicate Q(xs) is implied by the indexed predicate $P_R$.

One or more embodiments of automatic symbolic indexing provides an automated technique for expressing verification properties in a way that exploits the abstraction capabilities of lattice domains and reduces the number of variables necessary to represent the verification problem.

It will also be appreciated that the methods herein disclosed or methods substantially similar to those herein disclosed may be implemented in one of many programming languages (including but not limited to FL or C) and/or systems (including but not limited to COSMOS or FORTE) for performing automated computations using computing devices. Embodiments of such implementations may provide for arguments to specify, for example, circuit models, antecedent lists, and consequent lists.

Figure 12:
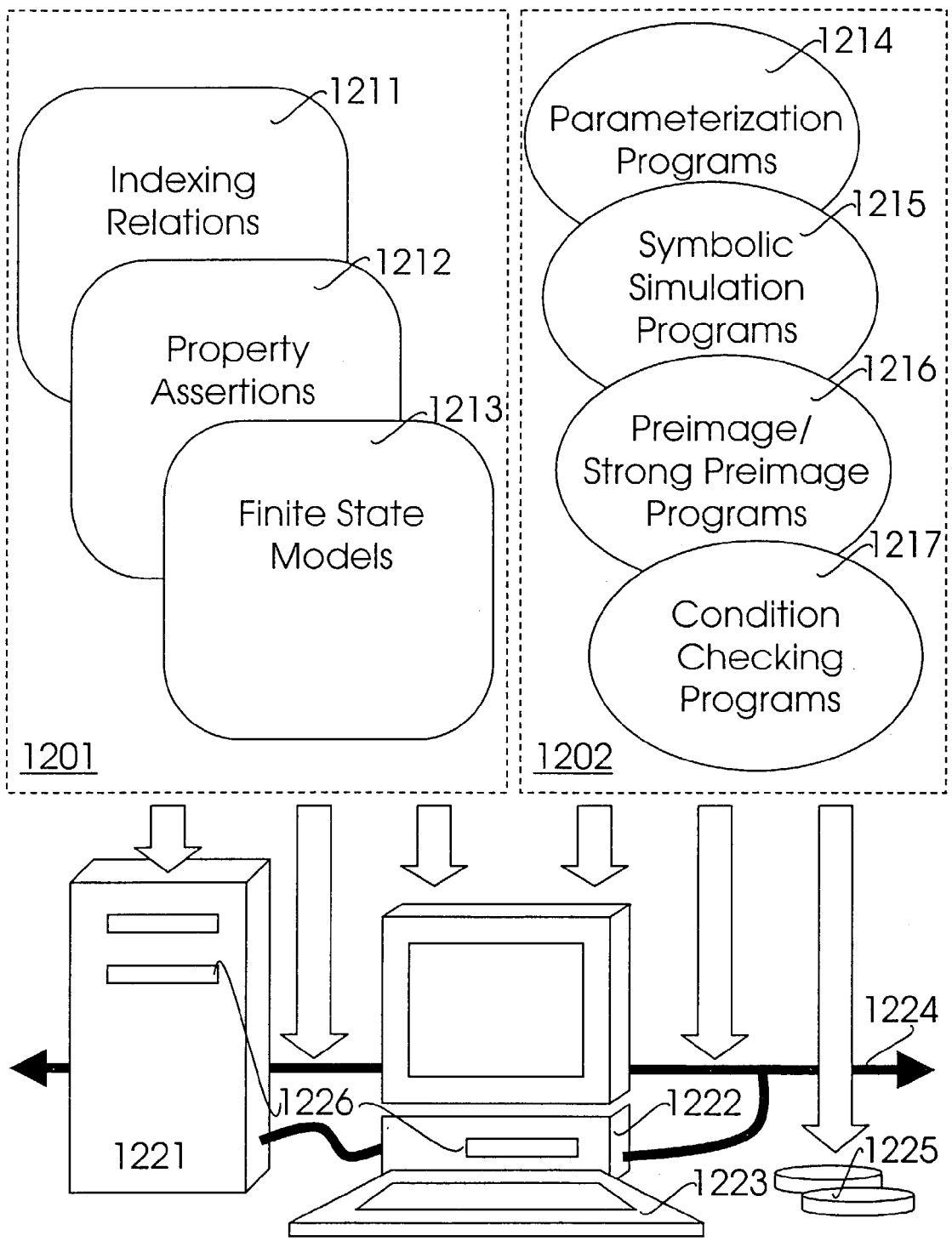
FIG. 12 depicts a computing system for automated formal verification of finite state systems.

For example, FIG. 12 illustrates a computer system to perform computations, for one such embodiment. Computer system 1222 is connectable with various storage, transmission and I/O devices to receive data structures and programmed methods. Representative data structures 1201 may include but are not limited to indexing relations 1211, property assertions 1212, and finite state models 1213. Representative programmed methods 1202 may include but are not limited to parameterization programs 1214, symbolic simulation programs 1215, preimage/strong preimage programs 1216, and condition checking programs 1217. Components of either or both of the data structures and programmed methods may be stored or transmitted on devices such as removable storage disks 1225, which may be accessed through an access device 1226 in computer system 1222 or in a storage serving system 1221. Storage serving system 1221 or computer system 1222 may also include other removable storage devices or non-removable storage devices suitable for storing or transmitting data structures 1201 or programmed methods 1202. Component data structures and programmed methods may also be stored or transmitted on devices such as network 1224 for access by computer system 1222 or entered by users through I/O device 1223. It will be appreciated that systems such as the one illustrated are commonly available and widely used in the art of designing finite state hardware and software systems. It will also be appreciated that the complexity, capabilities, and physical forms of such design systems improves and changes rapidly, and therefore understood that the design system illustrated is by way of example and not limitation.

The above description is intended to illustrate embodiments of the present invention. From the discussion above it should also be apparent that the invention can be modified in arrangement and detail by those skilled in the art without departing from the principles of the present invention within the scope of the accompanying claims.

What is claimed is:

1. A computer software product including one or more recordable media having executable instructions stored thereon which, when executed by a processing device, causes the processing device to:
   access a symbolic indexing relation including a first set of target variables and a second set of index variables; and
   apply the symbolic indexing relation to an assertion including an antecedent and a consequent to generate an indexed assertion.

2. The computer software product of claim 1 wherein applying the symbolic indexing relation comprises causing the processing device to:
   compute a preimage of the consequent with respect to the symbolic indexing relation.

3. The computer software product of claim 2 which, when executed by the processing device, further causes the processing device to:
   verify the indexed assertion having as an indexed consequent the preimage of the consequent with respect to the symbolic indexing relation.

4. The computer software product of claim 1 wherein applying the symbolic indexing relation comprises causing the processing device to:
   compute a strong preimage of the antecedent with respect to the symbolic indexing relation.

5. The computer software product of claim 4 wherein computing a strong preimage of the antecedent comprises causing the processing device to:
   compute a preimage of the antecedent with respect to the symbolic indexing relation; and
   compute a preimage of the complement of the antecedent with respect to the symbolic indexing relation.

6. The computer software product of claim 5 wherein computing a strong preimage of the antecedent further comprises causing the processing device to:
   compute a relative complement of the preimage of the antecedent and the preimage of the complement of the antecedent.

7. The computer software product of claim 5 wherein computing a strong preimage of the antecedent further comprises causing the processing device to:
   compute a first intersection of the preimage of the antecedent and the preimage of the complement of the antecedent; and
   compute a relative complement of the preimage of the antecedent and the first intersection.

8. The computer software product of claim 4 wherein applying the symbolic indexing relation further comprises causing the processing device to:
   compute a symbolic simulation using the strong preimage of the antecedent as an indexed antecedent of the indexed assertion.

9. The computer software product of claim 4 wherein applying the symbolic indexing relation further comprises causing the processing device to:
   apply the strong preimage of the antecedent to a model to generate an indexed model.
   compute a symbolic simulation using the indexed model.

10. A method comprising:
    specifying a symbolic indexing relation including a first set of index variables and a second set of target variables; and
    applying the indexing relation to an assertion including an antecedent and a consequent to generate an indexed assertion.

11. The method of claim 10 wherein applying the indexing relation to the assertion comprises:
    performing a first preimage calculation on the consequent to generate an indexed consequent comprising the first preimage.

12. The method of claim 11 wherein applying the indexing relation to the assertion further comprises:
    performing a strong preimage calculation on the antecedent to generate an indexed antecedent comprising the strong preimage.

13. The method of claim 12 wherein performing a strong preimage calculation on the antecedent comprises:
    performing a second preimage calculation on the antecedent to generate a second preimage;
    performing a third preimage calculation on a complement of the antecedent to generate a complement preimage;
    intersecting the second preimage and the complement preimage to identify an intersection; and
    computing a difference between the second preimage and the intersection to generate the strong preimage.

14. The method of claim 12 wherein performing a strong preimage calculation on the antecedent comprises:

performing a second preimage calculation on the antecedent to generate a second preimage;
performing a third preimage calculation on a complement of the antecedent to generate a complement preimage; and
computing a relative complement between the second preimage and the complement preimage to generate the strong preimage.

15. The method of claim 12 further comprising:
using the first preimage and the strong preimage to verify that the property assertion is satisfied.

16. A verification system comprising:
means for specifying a symbolic indexing relation including a first set of index variables and a second set of target variables; and
means for applying the indexing relation to an assertion including an antecedent and a consequent to generate an indexed assertion.

17. The verification system of claim 16 wherein the means for applying the indexing relation to an assertion comprises:
means for automatically indexing the antecedent to generate an indexed antecedent; and
means for automatically indexing the consequent to generate an indexed consequent.

18. The verification system of claim 16 further comprising:
means for automatically checking a first condition to determine whether the symbolic indexing relation indexes the set of target variables.

19. The verification system of claim 18 further comprising:
means for automatically checking a second condition to determine whether a model that satisfies an assertion including the indexed antecedent and the consequent also satisfies the assertion including the antecedent and the consequent.

20. The verification system of claim 19 further comprising:
means for automatically checking a third condition to determine whether the model that satisfies the indexed assertion including the indexed antecedent and the indexed consequent also satisfies the assertion including the indexed antecedent and the consequent.

21. A method comprising:
receiving a symbolic indexing relation including a first set of index variables and a second set of target variables; and
applying the indexing relation to an assertion including an antecedent and a consequent to generate an indexed assertion.

22. The method of claim 21 wherein applying the indexing relation to an assertion comprises:
computing a strong preimage of the antecedent to generate an indexed antecedent; and
computing a preimage of the consequent to generate an indexed consequent.

23. The method of claim 22 further comprising:
checking a first condition to determine whether the symbolic indexing relation indexes the set of target variables.

24. The method of claim 23 further comprising:
checking a second condition to determine whether a model that satisfies an assertion including the indexed antecedent and the consequent also satisfies the assertion including the antecedent and the consequent.

25. The method of claim 24 further comprising:
checking a third condition to determine whether the model that satisfies the indexed assertion including the indexed antecedent and the indexed consequent also satisfies the assertion including the indexed antecedent and the consequent.

26. An article of manufacture including one or more recordable media having data stored thereon which, when accessed by a processing device, causes the processing device to perform the method of claim 25.

27. An article of manufacture including one or more recordable media having data stored thereon which, when accessed by a processing device, causes the processing device to perform the method of claim 23.

28. An article of manufacture including one or more recordable media having data stored thereon which, when accessed by a processing device, causes the processing device to perform the method of claim 22.

29. A method comprising:
performing a first preimage calculation on an antecedent of an assertion to generate a first preimage;
performing a second preimage calculation on a complement of the antecedent to generate a second preimage; and
intersecting the first preimage and a complement of the second preimage to generate an indexed antecedent.

30. The method of claim 29 further comprising:
checking an indexing relation to determine whether it indexes each variable of the assertion.

31. A method comprising:
performing a first preimage calculation on an antecedent of an assertion to generate a first preimage;
performing a second preimage calculation on a complement of the antecedent to generate a second preimage; and
computing a relative complement between the first preimage and the second preimage to generate a strong preimage.

32. The method of claim 31 further comprising:
performing a third preimage calculation on a consequent of the assertion to generate a third preimage;
checking an indexing relation to determine whether it indexes each variable of the assertion; and
using the third preimage and the strong preimage to verify that the assertion is satisfied.

* * * * *